(12) United States Patent
Sargent

(10) Patent No.: US 6,628,686 B1
(45) Date of Patent: Sep. 30, 2003

(54) INTEGRATED MULTI-WAVELENGTH AND WIDEBAND LASERS

(75) Inventor: Edward H. Sargent, Toronto (CA)

(73) Assignee: Fox-Tek, Inc, West Chester, PA (US)

( * ) Notice: Subject to any disclaimer, the term of this patent is extended or adjusted under 35 U.S.C. 154(b) by 0 days.

(21) Appl. No.: 09/988,029

(22) Filed: Nov. 16, 2001

(51) Int. Cl.[7] .............................................. H01S 5/00
(52) U.S. Cl. ......................................... 372/45; 372/50
(58) Field of Search ........................... 372/27, 26, 102, 372/23, 45

(56) References Cited

U.S. PATENT DOCUMENTS

| | | | |
|---|---|---|---|
| 4,577,321 A | * 3/1986 | Carney et al. ................ 372/45 |
| 4,805,179 A | 2/1989 | Harder et al. |
| 4,871,690 A | 10/1989 | Holonyak, Jr. et al. |
| 5,155,737 A | * 10/1992 | Ikeda et al. ................ 372/102 |
| 5,298,454 A | 3/1994 | D'Asaro et al. |
| 5,353,295 A | 10/1994 | Holonyak, Jr. et al. |
| 5,395,793 A | 3/1995 | Charbonneau et al. |
| 5,425,043 A | 6/1995 | Holonyak, Jr. et al. |
| 5,455,429 A | 10/1995 | Paoli et al. |
| 5,539,763 A | 7/1996 | Takemi et al. |
| 5,574,745 A | 11/1996 | Paoli et al. |
| 5,608,753 A | 3/1997 | Paoli et al. |
| 5,699,375 A | 12/1997 | Paoli ........................... 372/50 |
| 5,707,890 A | 1/1998 | Emery et al. |
| 5,708,674 A | 1/1998 | Beernink et al. |
| 5,766,981 A | 6/1998 | Thornton et al. |
| 5,771,256 A | 6/1998 | Bhat |
| 5,843,802 A | 12/1998 | Beernink et al. |
| 5,850,408 A | * 12/1998 | Ouchi et al. .................. 372/27 |
| 5,882,951 A | 3/1999 | Bhat |
| 5,898,722 A | * 4/1999 | Ramdani et al. .............. 372/23 |
| 5,915,165 A | 6/1999 | Sun et al. |
| 6,027,989 A | 2/2000 | Poole et al. |
| 6,031,860 A | * 2/2000 | Nitta et al. .................. 372/102 |
| 6,075,804 A | 6/2000 | Deppe et al. .................. 372/96 |
| 6,215,804 B1 | * 4/2001 | Sahlen et al. ................ 372/26 |

OTHER PUBLICATIONS

J. Vac. Sci. Technol. A 16(2), Mar./Apr. 1998, "Characterization of annealed high–resistivity InP grown by He–plasma–assisted epitaxy," Authors: Pinkney et al.; pp. 772–775.
J. Vac. Sci. Technol. A 16(2), Mar./Apr. 1998, "Quantum well intermixing in material systems for 1.5 $\mu$m (invited)," Authors: Marsh et al.; pp. 810–816.
IEEE Photonics Technology Letters, vol. 8, No. 9, Sep. 1996, "10 Gb/s Wavelength Conversion with Integrated Multiquantum–Well–Based 3–Port Mach–Zehnder Interferometer," Authors: Idler et al.; pp. 1163–1165.
J. Appl. Phys. 79(2), Jan. 15, 1996, "Compositional disordering of InGaAs/GaAs heterostructures by low–temperature–grown GaAs layers," Authors: Tsang et al.; pp. 664–670.
IEEE Photonics Technology Letters, vol. 7, No. 9, Sep. 1995, "Monolithic Integration of InGaAsP–InP Stratined––Layer Distributed Feedback Laser and External Modulator by Selective Quantum–Well Interdiffusion," Authors: Ramdane et al.; pp. 1016–1018.

* cited by examiner

Primary Examiner—Paul Ip
Assistant Examiner—Hung T Vy
(74) Attorney, Agent, or Firm—Blank Rome, LLP

(57) ABSTRACT

A laser has a spatially varying absorption spectrum formed in a monolithic InGaAsP structure whose quantum well active structure has modified effective bandgap properties. The spatially varying emission spectrum allows emission at multiple wavelengths or emission in a broad band. The effective bandgap properties can be modified by rapid thermal annealing to cause the diffusion of defects from one or two InP defect layers into the quantum well active structure. The laser can be implemented variously as a Fabry-Perot laser and a laser array.

20 Claims, 2 Drawing Sheets

INTEGRATED MULTI-WAVELENGTH AND WIDEBAND LASERS

FIELD OF THE INVENTION

The present invention is directed to semiconductor lasers and more specifically to multi-wavelength and wideband lasers formed in a monolithic structure.

DESCRIPTION OF RELATED ART

Currently, multi-wavelength networks rely on a parallel array of many light sources (LED's or lasers) to generate many colors (wavelengths) of light for many-wavelength communication. (wavelength-division multiplexing, or WDM). These multiple signals are then connected into the input ports of multiplexer (e.g., an arrayed waveguide grating). In the absence of optical integration, this means a complex assembly process, e.g., N device-fiber coupling operations, where N is the number of wavelength channels. This solution shows poor scaling.

Tunable lasers are urgently needed in optical communications networks. Inventory of many different types of lasers, one for each needed wavelength, is costly. Furthermore, dynamic networks based on the use of different wavelengths to express different destinations for data depend on tunability. Today, tunable lasers are costly and are not so widely tunable as desired. Tunable lasers are required which can range over the set of all wavelengths of interest in future fiber optical communication networks. This range is much greater than what is conveniently available today. The fundamental limitation: the bandwidth over which optical gain can be provided is constrained if a single active region material is employed.

The realization of cost-effective local-area, access, enterprise, and data center fiber-optic networks will rely on finding ways to implement wavelength-division multiplexing with a few simple, low-cost components. In contrast, today's WDM systems are complicated multi-component systems with narrow tolerances and complex assembly. Their bandwidth is intrinsically limited by the fundamental statistical properties of electrons at room temperature.

U.S. patent application Ser. No. 09/833,078 to Thompson et al, filed Apr. 12, 2001, entitled "A method for locally modifying the effective bandgap energy in indium gallium arsenide phosphide (InGaAsP) quantum well structures," and published on Mar. 14, 2002, as U.S. Ser. No. 2002/0030185 A1, whose entire disclosure is hereby incorporated by reference into the present disclosure, teaches a method for locally modifying the effective bandgap energy of indium gallium arsenide phosphide (InGaAsP) quantum well structures. That method allows the integration of multiple optoelectronic devices within a single structure, each comprising a quantum well structure.

In one embodiment, as shown in FIG. 1A, an InGaAsP multiple quantum well structure 104 formed on a substrate 102 is overlaid by an InP (indium phosphide) defect layer 106 having point defects 108, which are donor-like phosphorus antisites or acceptor-like indium vacancies. Rapid thermal annealing (RTA) is carried out under a flowing nitrogen ambient, using a halogen lamp rapid thermal annealing system. During the rapid thermal annealing, the point defects 108 in the defect layer 106 diffuse into the active region of the quantum well structure 104 and modify its composite structure. The controlled inter-diffusion process causes a large increase in the bandgap energy of the quantum well active region, called a wavelength blue shift.

Another embodiment, as shown in FIG. 1B, uses two defect types, one to generate a wavelength blue shift and the other to decrease carrier lifetime. A first InP defect layer 110 contains slowly diffusing vacancy defects 114, while a second InP defect layer 112 includes rapidly diffusing group V interstitial defects 116. Rapid thermal annealing causes both types of defects to diffuse into the quantum well active region.

As will be familiar both from the above-cited application and from general skill in the art, a semiconductor quantum well structure has at least quantum well layer 120 bounded by barrier layers 122, 124.

However, a solution has not yet been found to the problems described above for tunable lasers.

SUMMARY OF THE INVENTION

In light of the above, it will be readily apparent that a need exists in the art to achieve two ends that may appear to be at odds with each other, namely, increased bandwidth and decreased size, complexity and expense. It is therefore an object of the invention to provide greater integration of lasers having multiple wavelengths or a wide emission band.

To achieve the above and other objects, the present invention is directed to a technique for producing multiple lasers in a single semiconductor device, using the techniques of the above-cited Thompson et al patent application or any other suitable intermixing techniques.

A first preferred embodiment of the invention concerns realization of a spatially serial multichannel transmitter with a single fiber coupling requirement for the realization of low-cost transceivers. The process of Thompson et al offers a method of creating LED's and, ultimately, lasers in which a number of wavelengths of optical emission may be chosen independently within a single device. This single, many-wavelength-producing device can then be coupled, through a single device-fiber coupling operation, into single-mode fiber. The method is potentially low-cost and exhibits excellent scaling with increased wavelength channel count, especially if assembly and packaging dominate total component cost.

A second preferred embodiment of the invention concerns realization of an ultra-wideband tunable Fabry-Perot laser in a single integrated device, achievable through wide tuning of the gain peak spectral location using multiple degrees of freedom coming through multiple spectrally shifted wavelength-tuning sections. The resulting device can serve as fast-wavelength-hopping transmitter. The process of the Thompson et al patent application permits realization of lasers with differentiated sections of active region, each with a different spectrum of light production. Independent control over the excitation of the various sections will permit the optical gain to be maximized at a wide range of possible wavelengths, selectable by electronic control. The resulting gain spectrum will determine the wavelength at which light will be produced. The resulting lasers will thus be widely tunable, greatly beyond the bandwidth available to devices made according to existing technology.

A third preferred embodiment of the invention concerns realization of an ultra-low-cost broadband, spectrally flat-tenable light source at, e.g., 1.55 $\mu$m for subsequent demultiplexing, modulation, and remultiplexing. The Thompson et al patent application provides a basis for realization of broadband light emitters which can address hundreds of nanometers of wavelength span, in contrast with current devices which can access tens of nanometers. That technology thus provides a basis for addressing a much greater bandwidth than in today's components, but in a way that is intrinsically integrated and prospectively cost-effective. The technology does this by allowing integrated realization of many independent sections of the device, each producing light over a relatively narrow (conventional) bandwidth, but together adding up to produce a controllably broad spectrum.

A fourth preferred embodiment of the invention realizes an array of lasers, either vertical-cavity or edge-emitting, on a single substrate having a single epitaxially-grown active region. Epitaxy-based spatially selective intermixing is used to shift the effective bandgap of the material differently in different regions. An array in space of lasers subsequently fabricated using this quantum well material will have different emission wavelengths by virtue of a combination of spectral gain peak shifting and (real) refractive index shifting.

BRIEF DESCRIPTION OF THE DRAWINGS

Preferred embodiments of the present invention will be set forth in detail with reference to the drawings, in which.

DETAILED DESCRIPTION OF THE PREFERRED EMBODIMENTS

Figure 1A:
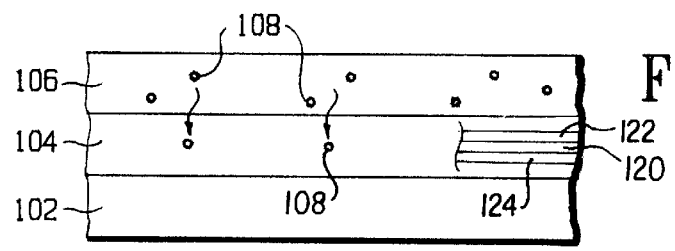
FIGS. 1A and 1B show two embodiments of the technique of the above-cited Thompson et al patent application.
Figure 1B:
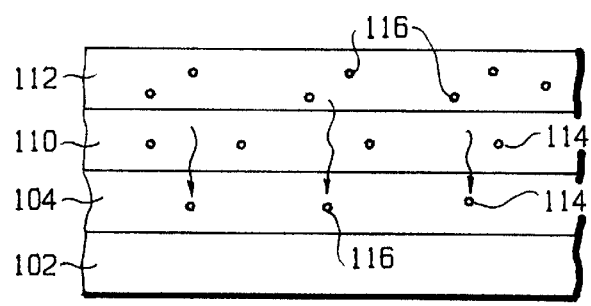

Preferred embodiments of the present invention will be set forth in detail with reference to the drawings, in which like reference numerals refer to like elements or operational steps throughout.

Figure 2:
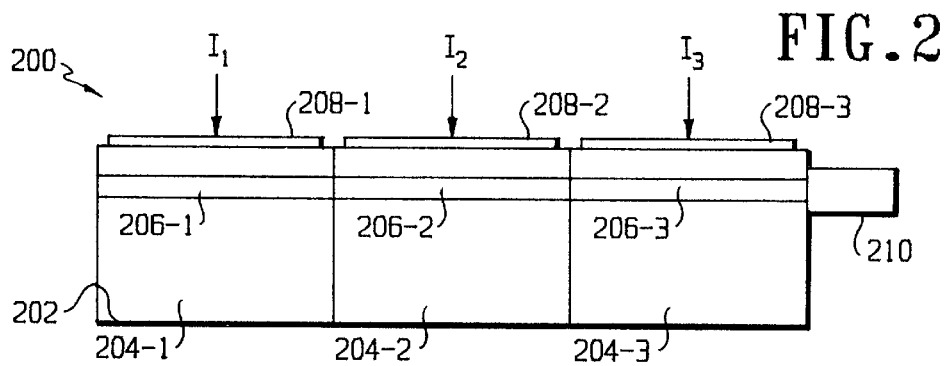
FIG. 2 shows a schematic diagram of the first preferred embodiment of the present invention.

FIG. 2 shows a schematic diagram of a first preferred embodiment of the present invention. The first preferred embodiment provides a many-wavelength-producing device in which multiple lasers producing different wavelengths are formed as separate active quantum well regions in a single semiconductor quantum well structure by the techniques of the above-cited Thompson et al patent application.

The many-wavelength-producing device 200 is formed as a semiconductor quantum well structure 202 having three (or another suitable number) sections 204-1, 204-2, 204-3. Each of the sections includes a quantum well active region 206-1, 206-2, 206-3 which functions as a laser at a different frequency when a current $I_1$, $I_2$, $I_3$ applied through an electrode 208-1, 208-2, 208-3. The light output by the quantum well active regions 206-1, 206-2, 206-3 is emitted in the left-to-right direction in FIG. 2 and is output through an output fiber 210.

The quantum well active regions 206-1, 206-2, 206-3 are formed by the techniques of the above-cited Thompson et al patent application or any other suitable intermixing techniques. Thus, multiple such quantum well active regions can be formed in a single monolithic structure 202.

The quantum well active regions 206-1, 206-2, 206-3 are tuned to output light at different frequencies. That may be done by any suitable technique, e.g., by varying the compositions or thicknesses of the quantum well active regions. For example, the quantum well active region 206-1 may be non-intermixed, while the quantum well active region 206-2 may be moderately intermixed and the quantum well active region 206-3 may be strongly intermixed. Each quantum well active region is characterized, relative to those regions to the left of it in FIG. 2, by a larger transition energy, higher-photon-energy light, and transparency to the lower-photon-energy light produced by the quantum well active regions to the left. The relative intensities of the light output by the various quantum well active regions can be controlled by varying the currents applied through the electrodes.

Figure 3:
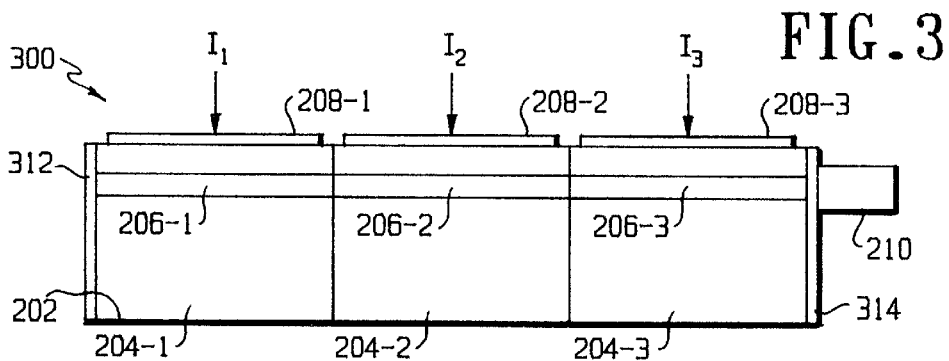
FIG. 3 shows a schematic diagram of the second preferred embodiment of the present invention.

FIG. 3 shows a schematic diagram of a second preferred embodiment of the present invention. The second preferred embodiment provides an ultra-wideband tunable Fabry-Perot laser in a single integrated device. The Fabry-Perot laser 300 of FIG. 3 can be structured like the many-wavelength-producing device 200 of FIG. 2, except that mirrors 312 and 314 are added to implement a Fabry-Perot resonant cavity. The quantum well active regions 206-1, 206-2, 206-3 provide regions with different spectra of light production. Independent control over the excitation of the various regions through the application of independently controllable currents to the electrodes permits the optical gain to be maximized over a wide range of possible wavelengths, selectable by electronic control. The resulting gain spectrum determines the wavelength at which the light is produced. The resulting Fabry-Perot laser 300 is thus widely tunable, well beyond the bandwidth possible in Fabry-Perot lasers of the prior art. The mirrors 312 and 314 can be of any suitable structure, e.g., silvered mirrors or multi-layer interference stacks. Existing techniques for enhancing and controlling tunability, such as the addition of further gratings or external cavities, may effectively be used in combination with this structure.

Figure 4:
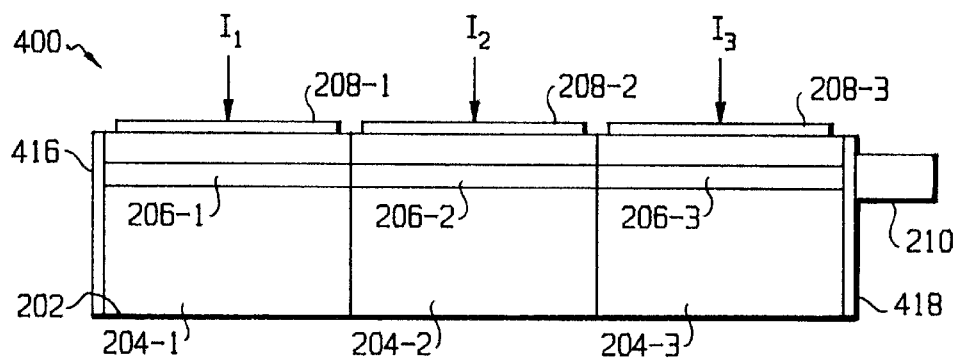
FIG. 4 shows a schematic diagram of the third preferred embodiment of the present invention.

FIG. 4 shows a schematic diagram of a third preferred embodiment of the present invention. The third preferred embodiment provides a wideband, spectrally flattenable light source for subsequent demultiplexing, modulation and remultiplexing. The spectrum can be centered on any suitable value, e.g., 1.55 μm. The light source 400 can be structured like the many-wavelength-producing device 200 of FIG. 2, except that antireflective coatings 416 and 418, which can be multi-layer interference coatings, are added. Each section provides light over a relatively narrow bandwidth; however, the multiple sections, independently controllable through the application of independently controllable currents through the electrodes, together provide a controllably broad spectrum.

Figure 5:
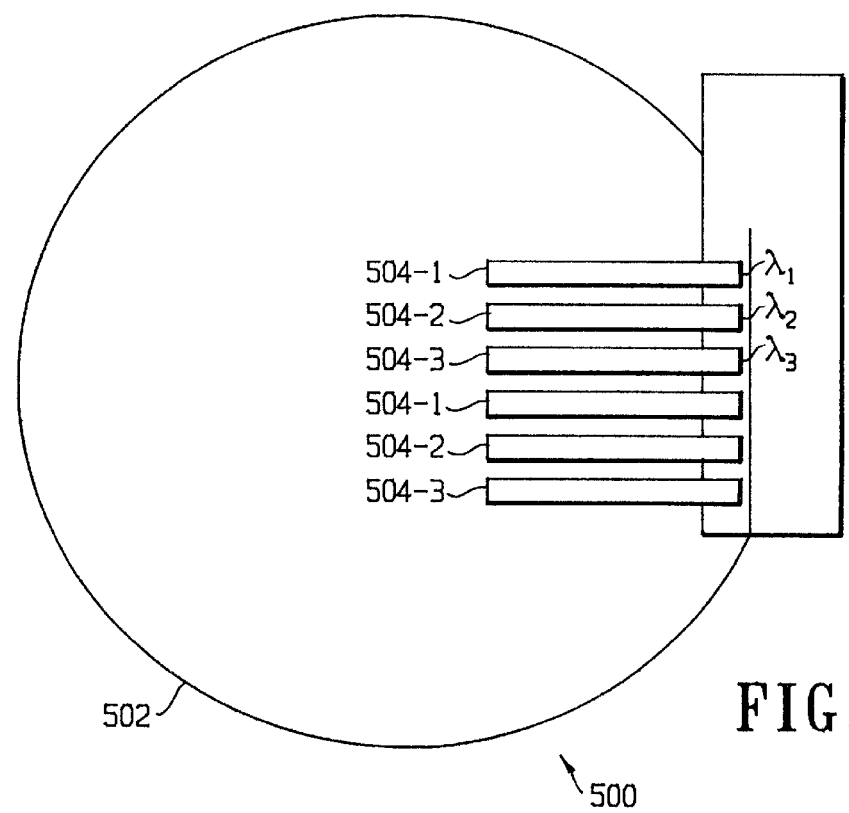
FIG. 5 shows a schematic diagram of the fourth preferred embodiment of the present invention.

FIG. 5 shows a schematic diagram of a fourth preferred embodiment of the present invention. The fourth preferred embodiment provides an array of lasers, either vertical-cavity or edge-emitting, on a single substrate formed as a single epitaxially grown active region. Epitaxy-based spatially-selective intermixing is used to shift the effective bandgap of the material differently in different regions. An array in space of lasers subsequently fabricated using this quantum well material will have different emission wavelengths by virtue of a combination of spectral gain peak shifting and (real) refractive index shifting.

The array 500, as seen from above in FIG. 5, is formed monolithically on a substrate 502. The lasers include non-intermixed regions 504-1 lasing at a wavelength $\lambda_1$, moderately intermixed regions 504-2 lasing at a wavelength $\lambda_2$, and strongly intermixed regions 504-3 lasing at a wavelength $\lambda_3$. The lasers in the array can be controlled by any suitable technique, e.g., a grid of electrodes. The principles of any of the first through third preferred embodiments can be incorporated as desired.

While four preferred embodiments have been set forth above, those skilled in the art who have reviewed the present disclosure will readily appreciate that other embodiments can be realized within the scope of the invention. For example, any suitable output waveguide waveguides or configuration of electrodes could be used. Therefore, the present invention should be construed as limited only by the appended claims.

I claim:

1. A laser for emitting light having a plurality of wavelengths and an intensity at each of the plurality of wavelengths, the laser comprising:

a semiconductor quantum well structure comprising at least one quantum well layer bounded by barrier layers;

a plurality of quantum well active regions formed in said at least one quantum well layer of said semiconductor quantum well structure, said plurality of quantum well active regions having effective bandgap properties which are modified relative to one another through intermixing in the active regions such that the quantum well active regions have different light emission spectra corresponding to the plurality of wavelengths; and a plurality of electrodes, one in electrical contact with each of the plurality of quantum well active regions, for applying a current to each of the plurality of quantum well active regions to control emission of the light at the plurality of wavelengths.

2. The laser of claim 1, wherein the plurality of quantum well active regions emit the light in a direction in which the plurality of quantum well active regions are arrayed, such that the light emitted by one of the plurality of quantum well active regions passes through at least one other of the plurality of quantum well active regions.

3. The laser of claim 2, further comprising an output optical fiber for receiving the light emitted by the plurality of quantum well active regions.

4. The laser of claim 2, further comprising a pair of mirrors for forming a Fabry-Perot cavity in which the plurality of quantum well active regions are disposed.

5. The laser of claim 2, further comprising a pair of antireflective coatings for preventing the light leaving the plurality of quantum well active regions from being reflected back into the plurality of quantum well active regions.

6. The laser of claim 1, wherein the bandgap properties vary in accordance with a spatial variation in a composition of the quantum well active regions.

7. The laser of claim 1, wherein said quantum well active regions are disposed in said semiconductor quantum well structure to form an array of laser elements.

8. The laser of claim 1, wherein each of the plurality of the quantum well active region is an indium gallium arsenide phosphide (InGaAsP) quantum well active region.

9. A method of making a laser for emitting light having a plurality of wavelengths, the method comprising:

(a) forming, in a semiconductor quantum well structure, a plurality of quantum well active regions; and (b) performing an intermixing in the active regions so as to modify effective bandgap properties in at least one of the quantum well active regions so that the effective bandgap properties vary among the plurality of quantum well active regions, such that the quantum well active regions have different light emission spectra corresponding to the plurality of wavelengths.

10. The method of claim 9, wherein the plurality of quantum well active regions emit the light in a direction in which the plurality of quantum well active regions are arrayed, such that the light emitted by one of the plurality of quantum well active regions passes through at least one other of the plurality of quantum well active regions.

11. The method of claim 10, further comprising providing an output optical fiber on said laser for receiving the light emitted by the plurality of quantum well active regions.

12. The method of claim 10, further comprising providing a pair of mirrors on said laser for forming a Fabry-Perot cavity in which the plurality of quantum well active regions are disposed.

13. The method of claim 10, further comprising providing a pair of antireflective coatings on said laser for preventing the light leaving the plurality of quantum well active regions from being reflected back into the plurality of quantum well active regions.

14. The method of claim 9, wherein step (b) comprises varying compositions of the quantum well active regions.

15. The method of claim 9, wherein said quantum well active regions are disposed in said semiconductor quantum well structure to form an array of laser elements.

16. The method of claim 9, wherein each of the plurality of quantum well active regions is an indium gallium arsenide phosphide (InGaAsP) quantum well active region.

17. The method of claim 16, wherein step (b) comprises rapid thermal annealing for controlled diffusion of defects into at least one of the quantum well active regions.

18. The method of claim 17, wherein step (b) comprises:

(i) on top of the semiconductor quantum well structure, providing a first indium phosphide (InP) layer with vacancy type defects, wherein the vacancy type defects act as slow diffusers;

(ii) on top of the first InP layer, providing a second InP layer with interstitial type defects, wherein the interstitial type defects act as fast diffusers; and (iii) applying a rapid thermal annealing process to the semiconductor quantum well structure for controlled diffusion of the vacancy type defects and the interstitial type defects into the quantum well active regions.

19. The method of claim 17, wherein step (b) comprises:

(i) on top of the semiconductor quantum well structure, providing an indium phosphide (InP) layer with point defects, wherein the point defects are donor-like phosphorus antisites or acceptor-like indium vacancies; and (ii) applying a rapid thermal annealing process for controlled diffusion of the point defects into the quantum well active regions.

20. The method of claim 9, wherein:

step (a) comprises epitaxially forming the plurality of quantum well active regions as a single active structure; and step (b) comprises spatially selectively modifying the effective bandgap properties in the single active structure.

* * * * *